United States Patent
Kawakita et al.

[11] Patent Number: 6,014,054
[45] Date of Patent: Jan. 11, 2000

[54] DIFFERENTIAL AMPLIFIER CIRCUIT AND LOAD DRIVING CIRCUIT INCORPORATING THE DIFFERENTIAL AMPLIFIER CIRCUIT

[75] Inventors: Keisuke Kawakita; Akira Ohmichi, both of Tokyo, Japan

[73] Assignee: Mitsubishi Denki Kabushiki Kaisha, Tokyo, Japan

[21] Appl. No.: 09/018,562

[22] Filed: Feb. 4, 1998

[30] Foreign Application Priority Data

Jul. 23, 1997 [JP] Japan ................................. 9-197102

[51] Int. Cl.⁷ ..................................................... G06G 7/12
[52] U.S. Cl. ........................... 327/563; 327/108; 327/56; 327/89; 330/260; 330/261
[58] Field of Search .......................... 327/52, 56, 65–67, 327/96, 89, 560–563, 108–112; 330/252, 258, 259, 260, 261

[56] References Cited

U.S. PATENT DOCUMENTS 5,266,853  11/1993  Itoh ............................................ 327/309
5,309,039  5/1994  Ghassemi et al. ....................... 327/542

FOREIGN PATENT DOCUMENTS 60-219803  11/1985  Japan .

*Primary Examiner*—Kenneth B. Wells
*Assistant Examiner*—Minh Nguyen
*Attorney, Agent, or Firm*—Leydig, Voit & Mayer, Ltd.

[57] ABSTRACT

A differential amplifier circuit has a differential amplifier circuit section for amplifying a difference voltage between an inverting input node and a non-inverting input node, and an output buffer circuit for outputting, to an output node, the amplified difference. The differential amplifier circuit section is connected to a first high potential power supply node and a first low potential power supply node, and is driven by potentials applied to the first high potential and first low potential power supply nodes. The output buffer circuit is connected to a second high potential power supply node and a second low potential power supply node, and is driven by potentials applied to the second high potential and low potential power supply nodes.

16 Claims, 5 Drawing Sheets

PRIOR ART

DIFFERENTIAL AMPLIFIER CIRCUIT AND LOAD DRIVING CIRCUIT INCORPORATING THE DIFFERENTIAL AMPLIFIER CIRCUIT

BACKGROUND OF THE INVENTION

1. Field of the Invention

The present invention relates to a differential amplifier circuit and a load driving circuit including the differential amplifier circuit. More specifically, the present invention relates to a differential amplifier circuit having a differential amplifier circuit section which amplifies a difference voltage between a non-inverting input node and an inverting input node, and an output buffer circuit, which outputs a signal based on the output of the differential amplifier circuit section.

2. Background Art

FIG. 9 shows a structure of a conventional differential amplifier circuit. In FIG. 9, reference numeral 1 denotes a high potential power supply node to which a positive power supply potential is applied; 2, a low potential power supply node at a ground potential; 5, an inverting input terminal to which a first input signal is input; 6, a non-inverting input terminal to which a second input signal is input; and 7, an output terminal. Reference numeral 10 denotes a differential amplifier circuit driven by potentials that are applied to the high potential and low potential power supply nodes 1 and 2. The differential amplifier circuit 10 amplifies a difference voltage between first and second input signals that are input to the inverting and non-inverting input terminals 5 and 6, respectively, and outputs an amplified difference voltage to the output terminal 7.

However, in the above-configured differential amplifier circuit, the dynamic range of the output signal depends on the potentials that are applied to the high potential and low potential power supply nodes 1 and 2.

In general, potential of 5 V or 12 V is used in a semiconductor integrated circuit device that incorporates the differential amplifier circuit. For example, where a potential of 5 V is applied to the high potential power supply node 1, the dynamic range of the output of the differential amplifier circuit 10 is about 0 V to about 5 V (correctly, it is narrower than this range because of the influence of a transistor at the output stage of the differential amplifier circuit 10). Where a potential of 12 V is applied to the high potential power supply node 1, the dynamic range of the output of the differential amplifier circuit 10 is about 0 V to about 12 V (correctly, it is narrower than this range because of the influence of a transistor at the output stage of the differential amplifier circuit 10).

Where a potential of 5 V is applied to the high potential power supply node 1 in the differential amplifier circuit 10, the upper potential limit of the output is not sufficiently close to 5 V.

Further, even where the output needs to be 5 V or more but need not be as high as 12 V, a potential of 12 V is applied to the high potential power supply node 1. In this case, the power consumption of the entire differential amplifier circuit is unnecessarily large.

SUMMARY OF THE INVENTION

The present invention has been made to solve the above problems, and an object of the present invention is therefore to provide, in a semiconductor integrated circuit device to which two different, positive potentials, for instance, are applied, a differential amplifier circuit having an output with a dynamic range that is higher than the lower potential power supply and lower than the higher potential power supply.

A second object of the present invention is to provide, in a semiconductor integrated circuit device to which two different, positive potentials, for instance, are applied, a load driving circuit including a differential amplifier circuit, the load driving circuit being low in power consumption and supplied with desired potentials.

According to one aspect of the present invention, a differential amplifier circuit comprises a differential amplifier circuit section and an output buffer circuit connected to the differential amplifier circuit section.

The differential amplifier circuit section is connected to a first high potential power supply node, to which a positive first potential is applied, and a first low potential power supply node, to which a ground potential is applied, and driven by potentials applied to the first high potential power supply node and the first low potential power supply node. The differential amplifier circuit section amplifies a signal based on the different voltage between a non-inverting input node and an inverting input node. Further, the output buffer circuit is connected to a second high potential power supply node, to which the positive first potential is applied, and to a second low potential power supply node, to which a second potential, lower than the first potential, is applied, and driven by potentials applied to the second high potential power supply node and the second low potential power supply node. The output buffer circuit outputs, to an output node, a signal based on the signal appearing at the output node of the differential amplifier circuit section.

According to another aspect of the present invention, in a load driving circuit, a first high potential power supply potential node is provided to which a first potential is applied. A first low potential power supply potential node is provided to which a second potential, lower than the first potential, is applied. A second high potential power supply node is provided to which a third potential, different from the first power supply potential, is applied. A second low potential power supply node is provided to which a fourth potential, lower than the third potential, is applied. A third high potential power supply node is provided to which a fifth potential, different from the first potential, is applied. A third low potential power supply node is provided to which a sixth potential, lower than the fifth potential, is applied. A first input terminal is provided to which a first input signal is applied. A second input terminal is provided to which a second input signal is applied. First and second output terminals are provided to which a load is to be connected.

Further, a first differential amplifier circuit is provided which includes a first differential amplifier circuit section and a first output buffer circuit. The first differential amplifier circuit section is connected to the first high potential power supply node and the first low potential power supply node, and has an inverting input node connected to the first input terminal and a non-inverting input node connected to the second input terminal. The first output buffer circuit is connected to the second high potential power supply node and the second low potential power supply node, and has an input node connected to the output node of the first differential amplifier circuit section and an output node connected to the first output terminal.

Further, a second differential amplifier circuit is provided which includes a section differential amplifier circuit section and a second output buffer circuit. The second differential amplifier circuit section is connected to the first high potential power supply node and the first low potential power supply node, and has a non-inverting input node connected to the first input terminal and an inverting input node connected to the second input terminal. The second output buffer circuit is connected between the third high potential power supply node and the third low potential power supply node, and has an input node connected to the output node of the second differential amplifier circuit section and an output node connected to the second output terminal.

In another aspect of the present invention, in the load driving circuit, an output reference potential node is provided to which an output reference potential is applied. A first resistive element connects the inverting input node of the first differential amplifier circuit section to the first input terminal. A second resistive element connects the non-inverting input node of the first differential amplifier circuit section to the second input terminal. A third resistive element connects the inverting input node of the first differential amplifier circuit section to the output node of the first output buffer circuit of the first differential amplifier circuit. A fourth resistive element connects the output reference potential node to the non-inverting input node of the first differential amplifier circuit section. A fifth resistive element connects the inverting input node of the second differential amplifier circuit section to the second input terminal. A sixth resistive element connects the non-inverting input node of the second differential amplifier circuit section to the first input terminal. A seventh resistive element connects the inverting input node of the second differential amplifier circuit section to the output node of the second output buffer circuit. An eighth resistive element connects the output reference potential node to the non-inverting input node of the second differential amplifier circuit section.

Other and further objects, features and advantages of the invention will appear more fully from the following description.

BRIEF DESCRIPTION OF THE DRAWINGS

This invention will be described in further detail by way of examples with reference to the accompanying drawings.

DESCRIPTION OF THE PREFERRED EMBODIMENTS

First Embodiment

Figure 1:
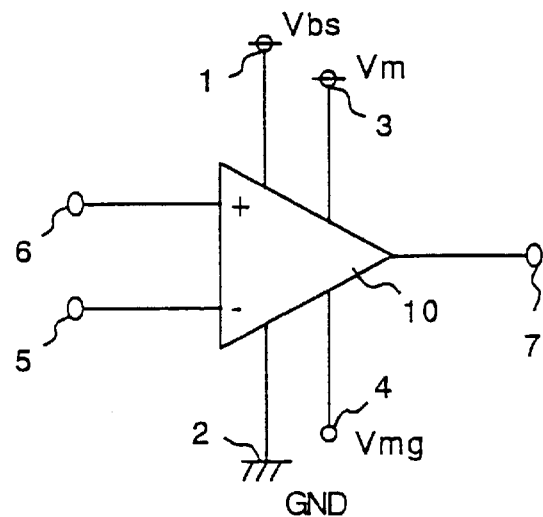
FIG. 1 shows a basic construction of a differential amplifier circuit according to a first embodiment of the present invention.
Figure 2:
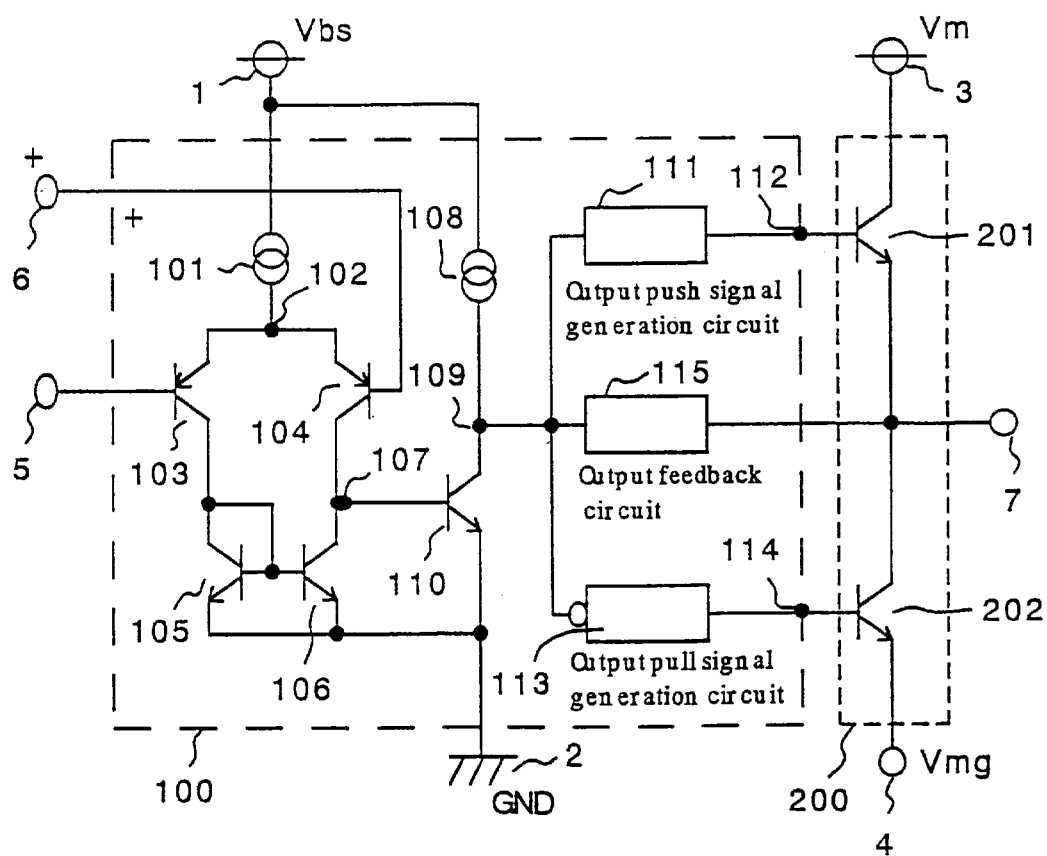
FIG. 2 shows a circuit configuration of a differential amplifier circuit according to a first embodiment of the present invention.

FIGS. 1 and 2 show a differential amplifier circuit according to a first embodiment of the present invention. In FIG. 1, reference numeral 1 denotes a first high potential power supply node to which a first potential Vbs is applied. In the first embodiment, the first potential Vbs is the higher of two different positive potentials and is 12 V, for instance. Reference numeral 2 denotes a first low potential power supply node to which a second potential, lower than the first potential Vbs, is applied. In the first embodiment, the second potential is the ground potential (GND). Reference numeral 3 denotes a second high potential power supply node separate from the first high potential power supply node 1 and supplied with a third potential Vm. In the first embodiment, the third potential Vm is either the higher of the two different positive potentials, for instance, 12 V, or the lower, for instance, 5 V. Reference numeral 4 denotes a second low potential power supply node to which a fourth voltage Vmg is applied, a potential that is lower than the third potential Vm. In the first embodiment, the fourth potential is either the lower of the two different positive potentials, for instance, 5 V, or the ground potential.

Reference numeral 5 denotes a first input terminal to which a first input signal is applied. In the first embodiment, the first input signal is a reference potential (potential for comparison). Numeral 6 denotes a second input terminal to which a second input signal is input. Numeral 7 denotes an output terminal to which a load is connected.

Further, reference numeral 10 denotes a differential amplifier circuit. As shown in FIG. 2, the differential amplifier circuit 10 comprises a differential amplifier circuit section 100, for amplifying a difference voltage appearing between an inverting input node "−" and a non-inverting input node "+", and an output buffer circuit 200 for outputting, to an output node, a signal that is based on an output signal appearing at the output node of the differential amplifier circuit 100.

The differential amplifier circuit section 100 is connected to the first high potential power supply node 1 and the first low potential power supply node 2, and is driven by the potentials applied to the first high potential power supply node 1 and the first low potential power supply node 2. The inverting input node "−" and the non-inverting input node "+" of the differential amplifier circuit section 100 are connected to the first and second input terminals 5 and 6, respectively.

The output buffer circuit 200 is connected to the second high potential power supply node 3 and the second low potential power supply node 4, and is driven by the potentials applied to the second high potential power supply node 3 and the second low potential power supply node 4. The input nodes and the output node of the output buffer circuit 200 are connected to the output nodes of the differential amplifier circuit section 100 and the output terminal 7, respectively.

For example, the differential amplifier circuit section 100 has a specific configuration shown in FIG. 2.

In FIG. 2, reference numeral 101 denotes a first constant current source which receives the first potential Vbs from the first high potential power supply node 1 and supplies a constant current to a first common node 102. Reference numeral 103 denotes a pnp bipolar transistor whose emitter electrode and base electrode are connected to the first common node 102 and the first input terminal 5, respectively. Reference numeral 104 denotes a pnp bipolar transistor whose emitter electrode, base electrode, and collector electrode are connected to the first common node 102, the second input terminal 6, and a first common output node 107, respectively. The transistors 103 and 104 constitute a differential transistor pair.

Reference numeral 105 denotes an npn bipolar transistor whose base electrode and collector electrodes are connected to each other and are also connected to a collector electrode of the transistor 103. The emitter electrode of the npn transistor 105 is connected to the first low potential power supply node 2. Reference numeral 106 denotes an npn bipolar transistor whose base electrode, collector electrode, and emitter electrode are connected to the base electrode of the transistor 105, the collector electrode of the transistor 104, and the first low potential power supply node 2, respectively. The transistors 105 and 106 are connected in a current mirror circuit.

Reference numeral 108 denotes a second constant current source which receives the first power supply potential Vbs from the first high potential power supply node 1 and supplies a constant current to a second common output node 109. Reference numeral 110 denotes an npn bipolar transistor whose base electrode, collector electrode, and emitter electrode are connected to the first common output node 107, a second common output node 109, and the first low power supply potential node 2, respectively.

Reference numeral 111 denotes an output push signal generation circuit driven by the potential Vbs applied between the first high potential power supply node 1 and the first low potential power supply node 2, and outputs a potential corresponding to a potential appearing at the second common output node 109 to a first output node 112. Reference numeral 113 denotes an output pull signal generation circuit driven by the potential Vbs applied between the first high potential power supply node 1 and the first low potential power supply node 2, and outputs, to a second output node 114, a potential that is in an inverted relationship with the output signal of the output push signal generation circuit 111, in accordance with the potential appearing at the second common output node 109. Reference numeral 115 denotes an output feedback circuit driven by the potential Vbs applied between the first high potential power supply node 1 and the first low potential power supply node 2, and stabilizes the potential appearing at the output terminal 7 by feeding back a potential corresponding to the potential at the output terminal 7 to the inputs of the output push signal generation circuit 111 and the output pull signal generation circuit 113.

Next, the output buffer circuit 200 has a specific configuration shown in a right side portion of FIG. 2.

In FIG. 2, reference numeral 201 denotes an npn bipolar transistor whose base electrode, collector electrode, and emitter electrode are connected to the first output node 112 of the differential amplifier circuit section 100, the second high potential power supply node 3, and the output terminal 7, respectively. Reference numeral 202 denotes an npn bipolar transistor whose base electrode, collector electrode, and emitter electrode are connected to the second output node 114 of the differential amplifier circuit section 100, the output terminal 7, and the second low potential power supply node 4, respectively.

In the differential amplifier circuit 10, the first high potential power supply node 1, the first low potential power supply node 2 for driving the differential amplifier circuit section 100, the second high potential power supply node 3, and the second low potential power supply node 4 for driving the output buffer circuit 200 are separate nodes. Therefore, for example, in a semiconductor integrated circuit device to which two different positive potentials (12 V and 5 V, for example) are applied, it is possible to apply any of the following three combinations of potentials to the second high potential power supply node 3 and the second low potential power supply node 4.

EXAMPLE 1

The first potential Vbs that is applied to the first high potential power supply node 1 is 12 V, and the second potential that is applied to the first low potential power supply node 2 is the ground potential.

The third potential Vm that is applied to the second high power potential supply node 3 is made equal to the first potential Vbs, i.e., 12 V. The fourth potential Vmg that is applied to the second low potential power supply node 4 is made equal to the second potential, i.e., the ground potential.

When the potentials are applied in the above manner, the dynamic range of the output of the differential amplifier circuit 10 is about 0 V to about 12 V. To be precise, the dynamic range is narrower than the potential difference between the third potential Vm applied to the second high potential power supply potential node 3, and the fourth potential Vmg applied to the second low potential power supply node 4, depending on the relation of the potentials applied to the bases of the transistors 201 and 202, the third potential Vm applied to the second high potential power supply node 3, and the fourth potential Vmg applied to the second low-potential power supply node 4.

EXAMPLE 2

The first potential Vbs applied to the first high potential power supply node 1 is 12 V, and the second potential applied to the first low potential power supply node 2 is set at the ground potential.

The third potential Vm applied to the second high potential power supply node 3 is made equal to the first potential Vbs, i.e., 12 V. The fourth potential Vmg that is applied to the second low potential power supply node 4 is 5 V.

When the potentials are applied in the above manner, the dynamic range of the output of the differential amplifier circuit 10 is about 5 V to about 12 V, and hence covers a range of about 7 V. To be precise, the upper limit of the dynamic range is somewhat lower than the third potential Vm that is applied to the second high potential power supply potential node 3, influenced by the transistor 201 of the output stage of the differential amplifier circuit 10. The lower limit of the dynamic range is somewhat higher than the fourth potential Vmg that is applied to the second low potential power supply node 4, influenced by the saturated on-state resistance of the transistor 202 of the output stage of the differential amplifier circuit 10.

Thus, in this example, a potential is obtained that is lower than the higher positive potential applied to the semiconductor integrated circuit device (12 V) and higher than the lower positive voltage (5 V). Further, since the potential difference between the second high potential power supply node 3 and the second low potential power supply node 4 is lower than the higher positive voltage (12 V), the power consumed by the output buffer circuit 200 is smaller than in the first example.

EXAMPLE 3

The first potential Vbs that is applied to the first high potential power supply node 1 is 12 V, and the second potential that is applied to the first low potential power supply node 2 is the ground potential.

The third potential Vm that is applied to the second high potential power supply node 3 is 5 V. The fourth potential Vmg that is applied to the second low potential power supply node 4 is made equal to the second potential, i.e., the ground potential.

When the potentials are applied in the above manner, the dynamic range of the output of the differential amplifier circuit 10 is about 0 V to about 5 V. To be precise, the upper limit of the output dynamic range is somewhat lower than the third potential Vm that is applied to the second high potential power supply node 3, influenced by the saturated on-state resistance of the transistor 201 of the output stage of the differential amplifier circuit 10. The lower limit of the output dynamic range is somewhat higher than the fourth potential Vmg that is applied to the second low potential power supply node 4, influenced by the transistor 202 of the output stage of the differential amplifier circuit 10.

Thus, in this example, the upper limit of the output dynamic range can be made equal to the lower positive voltage (5 V) that is almost applied to the semiconductor integrated circuit device. Further, the power that is consumed by the output buffer circuit 200 is smaller than in the second example.

Incidentally, where a wide dynamic range is not required, the following potentials may be applied to decrease power consumption.

The first potential Vbs that is applied to the first high potential power supply node 1 is 5 V, and the second potential that is applied to the first low potential power supply node 2 is the ground potential.

The third potential Vm that is applied to the second high potential power supply node 3 is made equal to the first potential Vbs, i.e., 5 V. The fourth potential Vmg that is applied to the fourth low potential power supply node 4 is made equal to the second potential, i.e., the ground potential.

When the potentials are applied in the above manner, the dynamic range of the output of the differential amplifier circuit 10 is about 0 V to about 5 V (correctly, it is narrower than this range because of the influence of a transistor at the output stage of the differential amplifier circuit 10). However, the power consumption is smaller than in the Examples 1, 2, and 3.

In the differential amplifier circuit 10, the output dynamic range can be selectively determined by the potentials applied to the second high potential power supply node 3 and the second low potential power supply node 4, which leads to an advantage that a desired output dynamic range can be obtained even after the differential amplifier circuit 10 is incorporated in a semiconductor integrated circuit device.

In addition, the dynamic range may be set at a potential difference that is between two different positive potentials, for instance, that are applied to a semiconductor integrated circuit device. In this case, unnecessarily large power consumption can be avoided.

Although the first embodiment is directed to the case where the two different positive potentials applied to the semiconductor integrated circuit device are 12 V and 5 V, the potentials are not limited to these values in the present invention.

Second Embodiment

Figure 3:
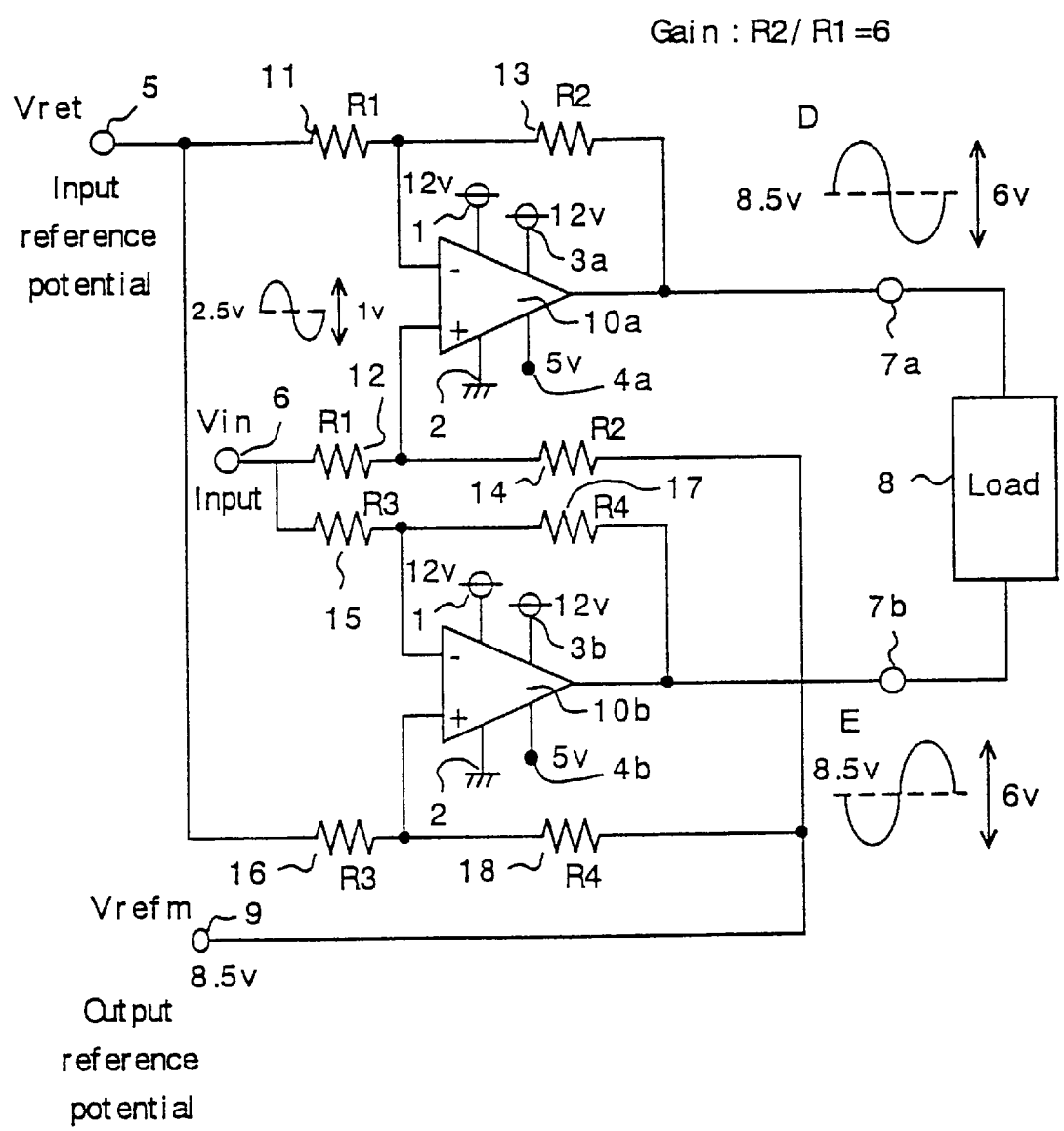
FIG. 3 shows a circuit construction of a load driving circuit according to a second embodiment of the present invention.

FIG. 3 shows a load driving circuit according to a second embodiment of the present invention. The load driving circuit in this second embodiment includes the differential amplifier circuit 10 of the first embodiment. For example, the load driving circuit of the second embodiment is a circuit that is incorporated in an actuator motor driver IC for a CD-ROM or a DVD and drives an actuator as a load.

In FIG. 3, reference numeral 1 denotes a first high potential power supply node to which a first potential Vbs is applied. In the second embodiment, the first potential Vbs is the higher of two different positive potentials and is 12 V, for instance. Reference numeral 2 denotes a first low potential power supply node to which a second potential, a voltage potential lower than the first potential Vbs, is applied. In the second embodiment, the second potential is the ground potential (GND).

Reference numeral 3a denotes a second high potential power supply node separate from the first high potential power supply node 1 and supplied with a third potential. In the second embodiment, the third potential is the higher of the two different positive potentials, for instance, 12 V, or the lower potential, for instance, 5 V. Reference numeral 4a denotes a second low potential power supply node to which a fourth voltage, a potential lower than the third potential, is applied. In the second embodiment, the fourth potential is the lower of the two different positive potentials, for instance, 5 V, or the ground potential.

Reference numeral 3b denotes a third high potential power supply node separate from the first high potential power supply node 1 and supplied with a fifth potential. In the second embodiment, the fifth potential is either the higher of the two different positive potentials, for instance, 12 V, or the lower potential, for instance, 5 V. The third high potential power supply node 3b is connected to the second high potential power supply node 3a. Reference numeral 4b denotes a third low potential power supply node to which a sixth voltage, a potential lower than the fifth potential, is applied. In the second embodiment, the sixth potential is the lower of the two different positive potentials, for instance, 5 V, or the ground potential. The third low potential power supply potential node 4b is connected to the second low potential power supply node 4a.

Reference numeral 5 denotes a first input terminal to which a first input signal is applied. In the second embodiment, the first input signal is a reference potential (potential for comparison) that is 1.65 V or 2.5 V, for instance. Numeral 6 denotes a second input terminal to which a second input signal is input. Numeral 7a denotes a first output terminal to which one end of a load 8 (for instance, an actuator) is connected, and numeral 7b denotes a second output terminal to which the other end of the load 8 is connected. The load 8 connected between the first and second output terminals 7a and 7b is driven by a current flowing from the first output terminal 7a to the second output terminal 7b and a current flowing from the second output terminal 7b to the first output terminal 7a.

Reference numeral 9 denotes an output reference potential node to which an output reference potential is applied. In the second embodiment, the output reference potential is ½ of the maximum potential difference appearing between the first and second output terminals 7a and 7b, that is, ½ of a difference voltage between the third and fifth potential that is applied to the second and third high potential power supply nodes 3a and 3b and the fourth and sixth potential that is applied to the second and third low potential power supply potential nodes 4a and 4b.

Reference numeral 10a denotes a first differential amplifier circuit including a differential amplifier circuit section 100 and an output buffer circuit 200 as shown in FIG. 2. The differential amplifier circuit section 100 is connected to the first high potential power supply node 1 and the first low potential power supply node 2, and has an inverting input node "−" connected to the first input terminal 5 and a non-inverting input node "+" connected to the second input terminal 6. The output buffer circuit 200 is connected to the second high potential power supply node 3a and the second low potential power supply node 4a, and has input nodes connected to output nodes (first and second output nodes 112 and 114) of the differential amplifier circuit section 100 (see FIG. 2), and an output node connected to the first output terminal 7a. The first differential amplifier 10a has the same configuration as the differential amplifier circuit 10 described as the first embodiment with reference to FIGS. 1 and 2.

Reference numeral 10b denotes a second differential amplifier circuit includes a differential amplifier circuit section 100 and an output buffer circuit 200 (see FIG. 2). The differential amplifier circuit section 100 is connected to the first high potential power supply node 1 and the first low potential power supply node 2, and has an inverting input node "−" connected to the second input terminal 6 and a non-inverting input node "+" connected to the first input terminal 5. The output buffer circuit 200 is connected to the third high potential power supply node 3b and the third low potential power supply node 4b, and has input nodes connected to output nodes (first and second output nodes 112 and 114) of the differential amplifier circuit section 100 (see FIG. 2), and an output node connected to the second output terminal 7b. The second differential amplifier 10b has the same configuration as the differential amplifier circuit 10 described as the first embodiment with reference to FIGS. 1 and 2.

Reference numeral 11 denotes a first resistive element connected to the first input terminal 5 and the inverting input node "−" of the differential amplifier circuit section 100 of the first differential amplifier circuit 10a. Reference numeral 12 denotes a second resistive element connected to the second input terminal 6 and the non-inverting input node "+" of the differential amplifier circuit section 100 of the first differential amplifier circuit 10a. In the second embodiment, the resistance R1 of the second resistive element 12 is equal to the resistance R1 of the first resistive element 11. Reference numeral 13 denotes a third resistive element connected to the inverting input node "−" of the differential amplifier circuit section 100 of the first differential amplifier circuit 10a and to the output node of the output buffer circuit 200. In the second embodiment, the ratio (R2/R1) of the resistance R2 of the third resistive element 13 to the resistance R1 of the first resistive element 11 is 3 to 6. Reference numeral 14 denotes a fourth resistive element connected to the output reference potential node 9 and the non-inverting input node "+" of the differential amplifier circuit section 100 of the first differential amplifier circuit 10a. In the second embodiment, the resistance R2 of the fourth resistive element 14 is equal to the resistance R2 of the third resistive element 13.

Reference numeral 15 denotes a fifth resistive element connected to the second input terminal 6 and the inverting input node "−" of the differential amplifier circuit section 100 of the second differential amplifier circuit 10b. In the second embodiment, the resistance R3 of the fifth resistive element 15 is equal to the resistance R1 of the first resistive element 11. Reference numeral 16 denotes a sixth resistive element connected to the first input terminal 5 and the non-inverting input node "+" of the differential amplifier circuit section 100 of the second differential amplifier circuit 10b. In the second embodiment, the resistance R3 of the sixth resistive element 16 is equal to the resistance R3 of the fifth resistive element 15. Reference numeral 17 denotes a seventh resistive element provided between the inverting input node "−" of the differential amplifier circuit section 100 of the second differential amplifier circuit 10b and the output node of the output buffer circuit 200. In the second embodiment, a resistance R4 of the seventh resistive element 17 is equal to the resistance R2 of the third resistive element 13, and a ratio (R4/R3) of the resistance R4 to the resistance R3 of the fifth resistive element 15 is set at 3 to 6. Reference numeral 18 denotes an eighth resistive element connected to the output reference potential node 9 and the non-inverting input node "+" of the differential amplifier circuit section 100 of the second differential amplifier circuit 10b. In the second embodiment, the resistance R4 of the eighth resistive element 18 is equal to the resistance R4 of the seventh resistive element 17.

Figure 4:
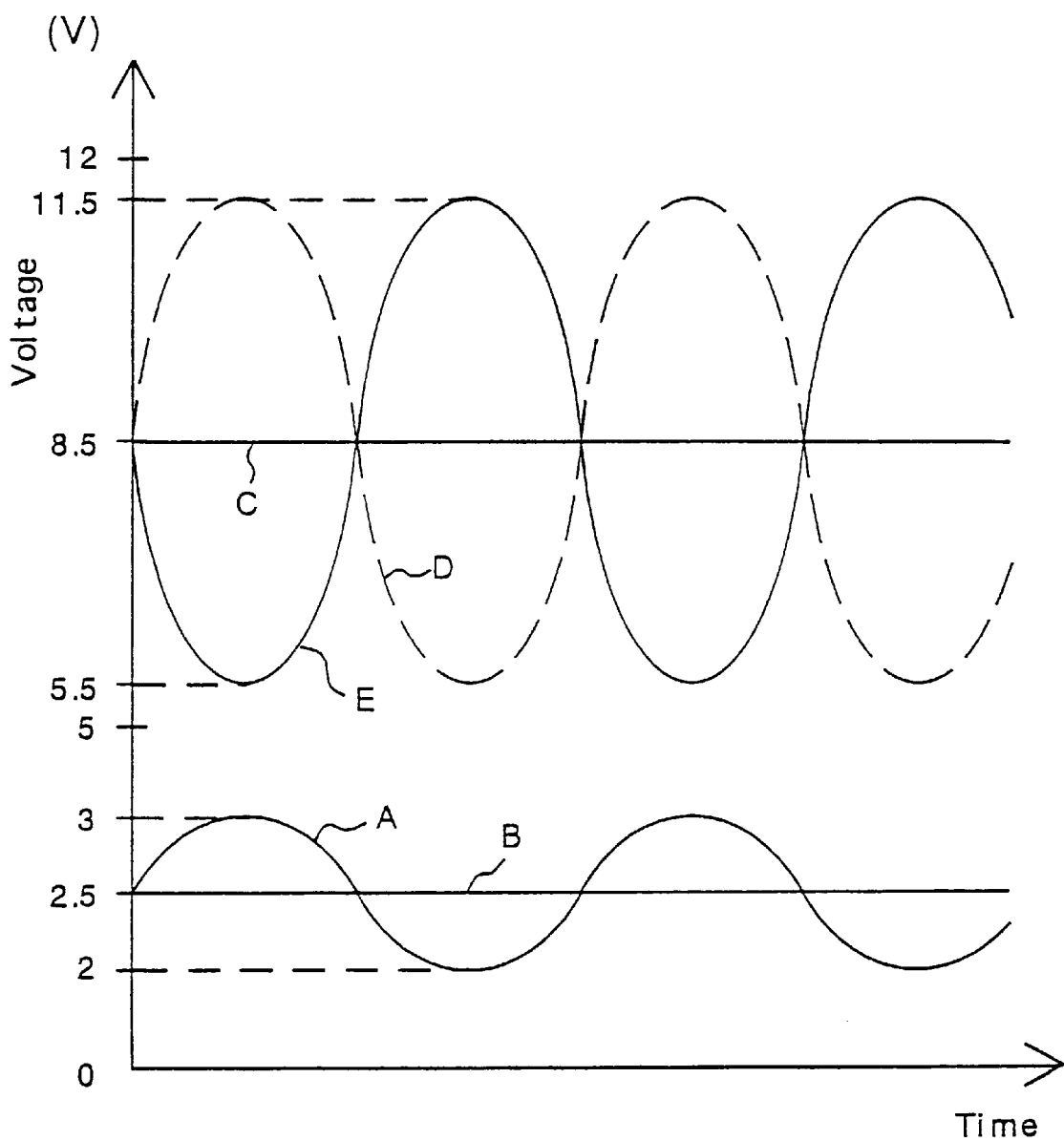
FIG. 4 shows voltage waveforms appearing in the load driving circuit shown in FIG. 3.

In the load driving circuit, output signals appear at the first and second output terminals 7a and 7b when an input signal shown by reference character "A" in FIG. 4, for instance, is applied to the second input terminal 6. In FIG. 4, reference character "B" denotes a reference potential, i.e., an input signal input to the first input terminal 5; reference character "C" denotes an output reference potential applied to the output reference potential node 9; reference character "D" denotes a first output potential appearing at the first output terminal 7a; reference character "E" denotes a second output potential appearing at the second output terminal 7b.

The waveforms shown in FIG. 4 are produced with the following settings. The first potential applied to the first potential high power supply node 1 is set at 12 V. The second potential applied to the first low potential power supply node 2 is the ground potential. The third and fifth potentials applied to the second and third high potential power supply nodes 3a and 3b are made equal to the first potential, i.e., 12 V. The fourth and sixth potentials applied to the second and third low potential power supply nodes 4a and 4b are 5 V. The reference potential input to the second input terminal 6 is 2.5 V. The output reference potential applied to the output reference potential node 9 is 8.5 (=(12+5)/2) V.

When the input signal "A" shown in FIG. 4 is input to the first input terminal 6, the first amplifier circuit 10a outputs, at the first output terminal 7a, a potential (Vin−Vref) (R2/R1)+Vrefm (see waveform "D" in FIG. 4) that is the sum of the output reference voltage Vrefm and a potential (Vin−Vref)(R2/R1) that is a difference potential, Vin−Vref, multiplied by R2/R1, i.e., the difference between a potential Vin at the second input terminal 6 and a potential Vref at the first input terminal 5.

On the other hand, the second amplifier circuit 10b outputs, at the second output terminal 7b, a potential (Vin−Vref)(−R4/R3)+Vrefm (see waveform "E" in FIG. 4) that is the sum of the output reference voltage Vrefm and a potential (Vin−Vref)(−R4/R3) that is a differential potential, Vin−Vref, inverted and multiplied by R4/R3, i.e., the difference between the potential Vin appearing at the second input terminal 6 and the potential Vref appearing at the first input terminal 5. The potential appearing at the second output terminal 7b is an inversion of the potential appearing at the first output terminal 7a with respect to the output reference voltage Vrefm.

Therefore, a difference potential between the potentials appearing at the first and second output terminals 7a and 7b is applied to the load 8, and a current corresponding to the difference potential flows through the load 8.

Under these conditions, the maximum difference between the potentials appearing at the first and second output terminals 7a and 7b corresponds to a difference between the maximum potential of 12 V and the minimum potential of 5 V at the outputs of the first and second differential amplifier circuits 10a and 10b.

Thus, the load driving circuit includes the first and second differential amplifier circuits 10a and 10b, each of which has a dynamic range (about 7 V) that is lower than the higher potential (12 V) and higher than the lower potential (5 V) of the positive potentials applied to the load driving circuit concerned. Further, an advantage is obtained that a difference potential (about 7 V) that is lower than the higher positive potential (12 V) and higher than the lower positive power supply potential (5 V) can be output between the first and second output terminals 7a and 7b to which the load 8 is connected.

Third Embodiment

Figure 5:
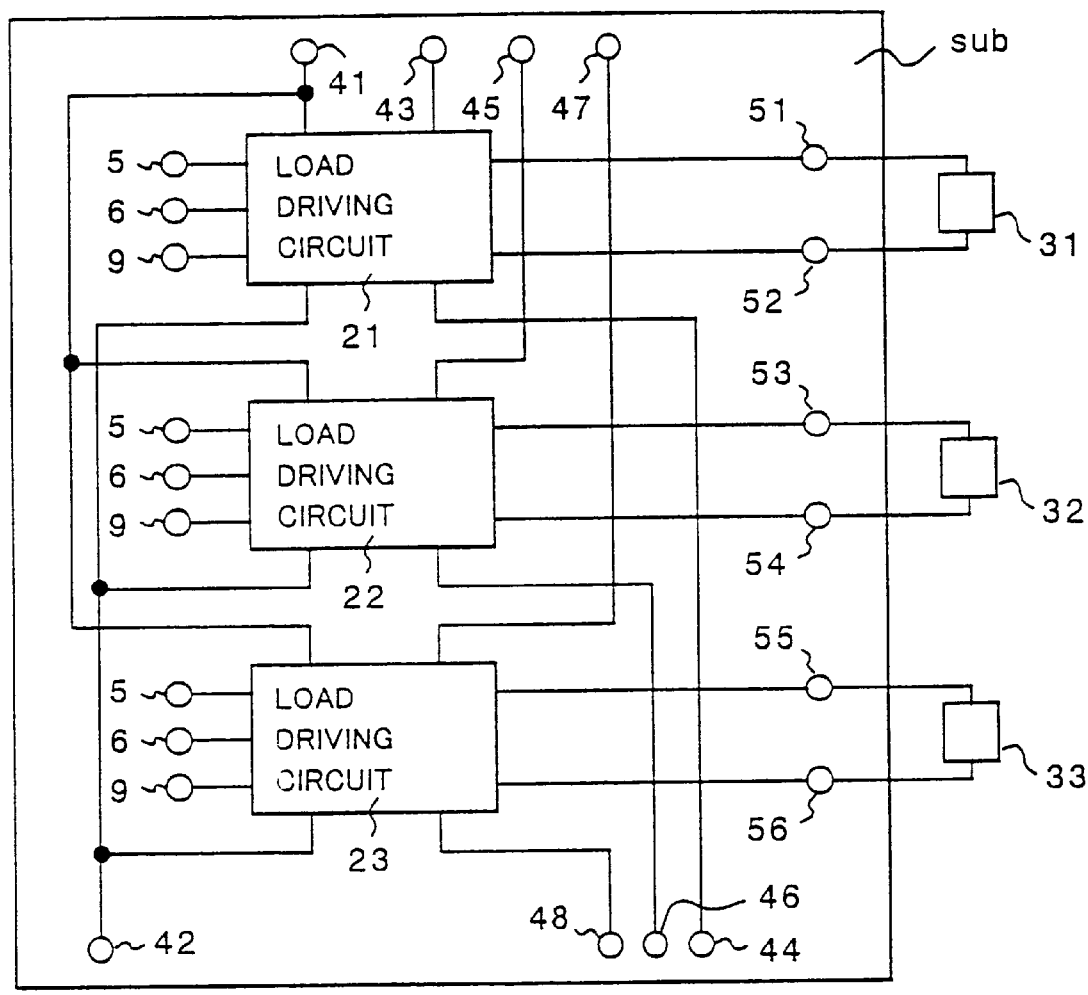
FIG. 5 shows a circuit structure of a load driving circuit in a semiconductor integrated circuit device according to a third embodiment of the present invention.

FIG. 5 shows a semiconductor integrated circuit device according to a third embodiment of the present invention. The semiconductor integrated circuit device in this second embodiment may be an actuator motor driver IC for a CD-ROM or a DVD, for instance. To drive a plurality of actuators as loads that are to receive different voltages, an actuator motor driver IC incorporates a plurality of load driving circuits.

FIG. 5 shows an example that incorporates three kinds of load driving circuits, that is, a first load driving circuit 21 for driving an actuator (first load 31) that is to be driven so as to receive a power supply voltage of about 12 V, a second load driving circuit 22 for driving another actuator (second load 32) that is to receive a voltage of about 7 V, and a third load driving circuit 23 for driving still another actuator (third load 33) that is to receive a voltage of about 5 V.

In FIG. 5, reference numeral 41 denotes a first high potential power supply pad located on the surface of a semiconductor substrate "sub" and supplied with a first potential (12 V in the third embodiment) from outside of the semiconductor integrated circuit device. Reference numeral 42 denotes a first low potential power supply pad located on the surface of the semiconductor substrate "sub" and supplied with a second potential (ground potential (GND) in the third embodiment) from outside of the semiconductor integrated circuit device.

Reference numeral 43 denotes a second high potential power supply pad for the first load driving circuit 21, the pad being located on the surface of the semiconductor substrate "sub" and supplied with a third potential (in the third embodiment, 12 V for the first load driving circuit 21) from outside the semiconductor integrated circuit device. Reference numeral 44 denotes a second low potential power supply pad for the first load driving circuit 21, located on the surface of the semiconductor substrate "sub", and supplied with a fourth potential (in the third embodiment, the ground potential for the first load driving circuit 21) from outside the semiconductor integrated circuit device.

Reference numeral 45 denotes a second high potential power supply pad for the second load driving circuit 22, which pad is located on the surface of the semiconductor substrate "sub" and supplied with a third potential (in the third embodiment, 12 V for the second load driving circuit 22) from outside of the semiconductor integrated circuit device. Reference numeral 46 denotes a second low potential power supply potential pad for the second load driving circuit 22, which pad is located on the surface of the semiconductor substrate "sub" and supplied with a fourth potential (in the third embodiment, 5 V for the second load driving circuit 22) from outside of the semiconductor integrated circuit device.

Reference numeral 47 denotes a second high potential power supply pad for the third load driving circuit 23, which pad is located on the surface of the semiconductor substrate "sub" and supplied with a third potential (in the third embodiment, 5 V for the third load driving circuit 23) from outside of the semiconductor integrated circuit device. Reference numeral 48 denotes a second low potential power supply pad for the third load driving circuit 23, which pad is located on the surface of the semiconductor substrate "sub" and supplied with a fourth potential (in the third embodiment, the ground potential for the third load driving circuit 23) from outside of the semiconductor integrated circuit device.

Reference numeral 51 denotes a first output pad for the first load driving circuit 21, which pad is located on the surface of the semiconductor substrate "sub" and connected to one end of the first load 31. Numeral 52 denotes a second output pad for the first load driving circuit 21, which pad is located on the surface of the semiconductor substrate "sub" and connected to the other end of the first load 31. Reference numeral 53 denotes a first output pad for the second load driving circuit 22, which pad is located on the surface of the semiconductor substrate "sub" and connected to one end of the second load 32. Reference numeral 54 denotes a second output pad for the second load driving circuit 22, which pad is located on the surface of the semiconductor substrate "sub" and connected to the other end of the second load 32. Reference numeral 55 denotes a first output pad for the third load driving circuit 23, which pad is located on the surface of the semiconductor substrate "sub" and connected to one end of the third load 33. Reference numeral 56 denotes a second output pad for the third load driving circuit 23, which pad is located on the surface of the semiconductor substrate "sub" and connected to the other end of the third load 33.

The first load driving circuit 21 is located on the surface of the semiconductor substrate "sub" and drives and controls the first load 31. The first load driving circuit 21 has the same configuration as the load driving circuit described as the second embodiment with reference to FIG. 3. The first high potential power supply node 1 and the first low potential power supply node 2, to which the differential amplifier circuit sections 100 of the first and second differential amplifier circuits 10a and 10b of the first load driving circuit 21 are connected, are electrically connected to the first high potential power supply pad 41 and the first low potential power supply pad 42, respectively. The second and third high potential power supply nodes 3a and 3b, to which the output buffer circuits 200 of the first and second differential amplifier circuits 10a and 10b of the first load driving circuit 21 are connected, are electrically connected to the second high potential power supply pad 43. The second and third low potential power supply nodes 4a and 4b are electrically connected to the second low potential power supply pad 44. The first and second output terminals 7a and 7b of the first load driving circuit 21 are connected to the output pads 51 and 52, respectively.

Figure 6:
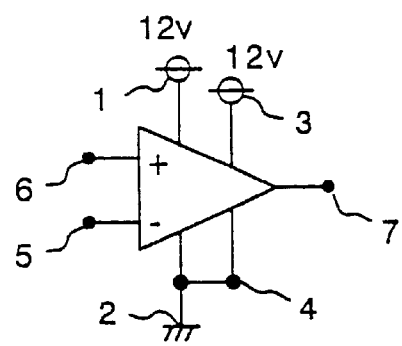
FIGS. 6, 7, and 8 show equivalent circuit diagrams of first, second, and third differential amplifier circuits incorporated in the semiconductor integrated circuit device shown in FIG. 5.

Thus, in the third embodiment, as shown in the equivalent circuit diagram of FIG. 6, each differential amplifier circuit section 100 and each output buffer circuit 200 is driven by 12 V in the first and second differential amplifier circuits 10a and 10b of the first load driving circuit 21.

Further, a potential difference that is about 12 V at the maximum appears between the first and second output pads 51 and 52, and hence allows driving of the first load 31.

The second load driving circuit 22 is located on the surface of the semiconductor substrate "sub" and drives and controls the second load 32. The second load driving circuit 22 has the same configuration as the load driving circuit described as the second embodiment with reference to FIG. 3. The first high potential power supply node 1 and the first low potential power supply node 2, to which the differential amplifier circuit sections 100 of the first and second differential amplifier circuits 10a and 10b of the second load driving circuit 22 are connected, are electrically connected to the first high potential power supply pad 41 and the first low potential power supply pad 42, respectively. The second and third high potential power supply nodes 3a and 3b, to which the output buffer circuits 200 of the first and second differential amplifier circuits 10a and 10b of the second load driving circuit 22 are connected, are electrically connected to the second high potential power supply pad 45. The second and third low potential power supply nodes 4a and 4b are electrically connected to the second low potential power supply pad 46. The first and second output terminals 7a and 7b of the second load driving circuit 22 are connected to the output pads 53 and 54, respectively.

Figure 7:
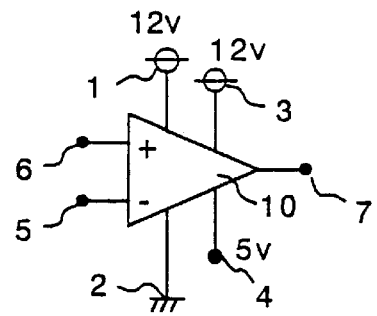

Thus, in the third embodiment, as shown in the equivalent circuit diagram of FIG. 7, each differential amplifier circuit section 100 is driven by 12 V and each output buffer circuit 200 is driven by 7 V (difference voltage between 12 V and 5 V) in the first and second differential amplifier circuits 10a and 10b of the second load driving circuit 22.

Further, a potential difference that is about 7 V at the maximum appears between the first and second output pads 53 and 54, and hence allows driving of the second load 32.

The third load driving circuit 23 is located on the surface of the semiconductor substrate "sub" and drives and controls the third load 33. The third load driving circuit 23 has the same configuration as the load driving circuit described in the second embodiment with reference to FIG. 3. The first high potential power supply node 1 and the first low potential power supply node 2, to which the differential amplifier circuit sections 100 of the first and second differential amplifier circuits 10a and 10b of the third load driving circuit 23 are connected, are electrically connected to the first high potential power supply pad 41 and the first low potential power supply pad 42, respectively. The second and third high potential power supply nodes 3a and 3b, to which the output buffer circuits 200 of the first and second differential amplifier circuits 10a and 10b of the third load driving circuit 23 are connected, are electrically connected to the second high potential power supply pad 47. The second and third low potential power supply nodes 4a and 4b are electrically connected to the second potential low power supply pad 48. The first and second output terminals 7a and 7b of the third load driving circuit 23 are connected to the output pads 55 and 56, respectively.

Figure 8:
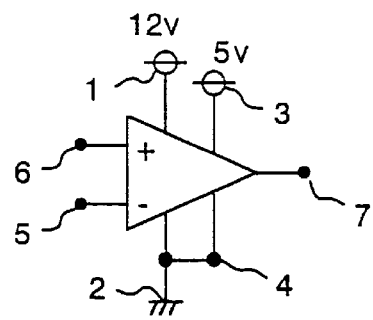
Figure 9:
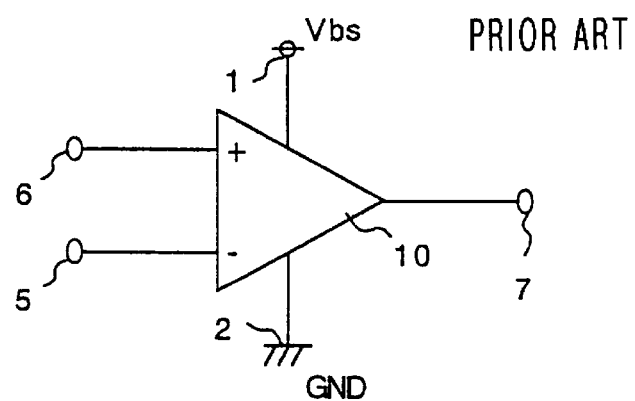
FIG. 9 shows a conventional differential amplifier circuit.

Thus, in the third embodiment, as shown in the equivalent circuit diagram of FIG. 8, each differential amplifier circuit section 100 is driven by 12 V and each output buffer circuit 200 is driven by 5 V in the first and second differential amplifier circuits 10a and 10b of the third load driving circuit 23.

Further, a potential difference that is about 5 V at the maximum appears between the first and second output pads 55 and 56, and hence allows driving of the third load 33.

The semiconductor integrated circuit device provides the following advantage. The semiconductor integrated circuit device can incorporate the first to third load driving circuits 21–23 irrespective of the kind of the first to third loads 31–33. In connecting the first to third loads 31–33 to the first and second output pads 51–56, the first to third load driving circuits 21–23 can be made suitable for the first to third loads 31–33, respectively, by properly selecting power supply potentials applied to the second high potential and low potential power supply pads 43–48.

Although the third embodiment includes three load driving circuits 21–23, in the present invention the number of load driving circuits is not limited to three.

Obviously many modifications and variations of the present invention are possible in light of the above teachings. It is therefore to be understood that within the scope of the appended claims, the invention may by practiced otherwise than as specifically described.

What is claimed is:

1. A load driving circuit comprising:
    a first high potential power supply node to which a first potential is applied;
    a first low potential power supply node to which a second potential, lower than the first potential, is applied;
    a second high potential power supply node to which a third potential, different from the first potential, is applied;
    a second low potential power supply node to which a fourth potential, lower than the third potential, is applied;
    a third high potential power supply node to which a fifth potential, different from the first potential, is applied;
    a third low potential power supply node to which a sixth potential, lower than the fifth potential, is applied;
    a first input terminal to which a first input signal is applied;
    a second input terminal to which a second input signal is applied;
    first and second output terminals to which a load is to be connected;
    a first differential amplifier circuit including:
        a first differential amplifier circuit section connected to the first high potential power supply node and the first low potential power supply node, and having a non-inverting input node connected to the second input terminal, an inverting input node connected to the first input terminal, and an output node; and
        a first output buffer circuit connected to the second high potential power supply node and the second low potential power supply node, and having an input node connected to the output node of the first differential amplifier circuit section and an output node connected to the first output terminal; and
    a second differential amplifier circuit including:
        a second differential amplifier circuit section connected to the first high potential power supply node and the first low potential power supply potential node, and having a non-inverting input node connected to the first input terminal, an inverting input node connected to the second input terminal, and an output node; and
        a second output buffer circuit connected between the third high potential power supply potential node and the third low potential power supply potential node, and having an input node connected to the output node of the second differential amplifier circuit section and an output node connected to the second output terminal.

2. The load driving circuit according to claim 1, wherein the third and fifth potentials are equal to each other, and the fourth and sixth potentials are equal to each other.

3. The load driving circuit according to claim 2, wherein the first potential is a positive power supply potential and the second potential is a ground potential, and wherein the third and fifth potentials are equal to the first potential and the fourth and sixth potentials are a positive potential higher than the ground potential.

4. The load driving circuit according to claim 3, wherein the first input signal is a reference potential.

5. The load driving circuit according to claim 4, further comprising:

an output reference potential node to which an output reference potential is applied;

a first resistive element connecting the inverting input node of the first differential amplifier circuit section to the first input terminal;

a second resistive element connecting the non-inverting input node of the first differential amplifier circuit section to the second input terminal;

a third resistive element connecting the inverting input node of the first differential amplifier circuit section to the output node of the first output buffer circuit;

a fourth resistive element connecting the output reference potential node to the non-inverting input node of the first differential amplifier circuit section;

a fifth resistive element connecting the inverting input node of the second differential amplifier circuit section to the second input terminal;

a sixth resistive element connecting the non-inverting input node of the second differential amplifier circuit section to the first input terminal;

a seventh resistive element connecting the inverting input node of the second differential amplifier circuit section to the output node of the second output buffer circuit; and an eighth resistive element connecting the output reference potential node to the non-inverting input node of the second differential amplifier circuit section.

6. The load driving circuit according to claim 5, wherein the first and second resistive elements have the same resistance, the third and fourth resistive elements have the same resistance, the fifth and sixth resistance elements have the same resistance, and the seventh and eighth resistive elements have the same resistance.

7. The load driving circuit according to claim 2, wherein the first input signal is a reference potential.

8. The load driving circuit according to claim 7, further comprising:

an output reference potential node to which an output reference potential is applied;

a first resistive element connecting the inverting input node of the first differential amplifier circuit section to the first input terminal;

a second resistive element connecting the non-inverting input node of the first differential amplifier circuit section to the second input terminal;

a third resistive element connecting the inverting input node of the first differential amplifier circuit section to the output node of the first output buffer circuit;

a fourth resistive element connecting the output reference potential node to the non-inverting input node of the first differential amplifier circuit section;

a fifth resistive element connecting the inverting input node of the second differential amplifier circuit section to the second input terminal;

a sixth resistive element connecting the non-inverting input node of the second differential amplifier circuit section to the first input terminal;

a seventh resistive element connecting the inverting input node of the second differential amplifier circuit section to the output node of the second output buffer circuit; and an eighth resistive element connecting the output reference potential node to the non-inverting input node of the second differential amplifier circuit section.

9. The load driving circuit according to claim 8, wherein the first and second resistive elements have the same resistance, the third and fourth resistive elements have the same resistance, the fifth and sixth resistance elements have the same resistance, and the seventh and eighth resistive elements have the same resistance.

10. The load driving circuit according to claim 2, further comprising:

an output reference potential node to which an output reference potential is applied;

a first resistive element connecting the inverting input node of the first differential amplifier circuit section to the first input terminal;

a second resistive element connecting the non-inverting input node of the first differential amplifier circuit section to the second input terminal;

a third resistive element connecting the inverting input node of the first differential amplifier circuit section to the output node of the first output buffer circuit;

a fourth resistive element connecting the output reference potential node to the non-inverting input node of the first differential amplifier circuit section;

a fifth resistive element connecting the inverting input node of the second differential amplifier circuit section to the second input terminal;

a sixth resistive element connecting the non-inverting input node of the second differential amplifier circuit section to the first input terminal;

a seventh resistive element connecting the inverting input node of the second differential amplifier circuit section to the output node of the second output buffer circuit; and an eighth resistive element connecting the output reference potential node to the non-inverting input node of the second differential amplifier circuit section.

11. The load driving circuit according to claim 10, wherein the first and second resistive elements have the same resistance, the third and fourth resistive elements have the same resistance, the fifth and sixth resistance elements have the same resistance, and the seventh and eighth resistive elements have the same resistance.

12. The load driving circuit according to claim 1, wherein the first input signal is a reference potential.

13. The load driving circuit according to claim 12, further comprising:

an output reference potential node to which an output reference potential is applied;

a first resistive element connecting the inverting input node of the first differential amplifier circuit section to the first input terminal;

a second resistive element connecting the non-inverting input node of the first differential amplifier circuit section to the second input terminal;

a third resistive element connecting the inverting input node of the first differential amplifier circuit section to the output node of the first output buffer circuit;

a fourth resistive element connecting the output reference potential node to the non-inverting input node of the first differential amplifier circuit section;

a fifth resistive element connecting the inverting input node of the second differential amplifier circuit section to the second input terminal;

a sixth resistive element connecting the non-inverting input node of the second differential amplifier circuit section to the first input terminal;

a seventh resistive element connecting the inverting input node of the second differential amplifier circuit section to the output node of the second output buffer circuit; and an eighth resistive element connecting the output reference potential node to the non-inverting input node of the second differential amplifier circuit section.

14. The load driving circuit according to claim 13, wherein the first and second resistive elements have the same resistance, the third and fourth resistive elements have the same resistance, the fifth and sixth resistance elements have the same resistance, and the seventh and eighth resistive elements have the same resistance.

15. The load driving circuit according to claim 1, further comprising:

an output reference potential node to which an output reference potential is applied;

a first resistive element connecting the inverting input node of the first differential amplifier circuit section to the first input terminal;

a second resistive element connecting the non-inverting input node of the first differential amplifier circuit section to the second input terminal;

a third resistive element connecting the inverting input node of the first differential amplifier circuit section to the output node of the first output buffer circuit;

a fourth resistive element connecting the output reference potential node to the non-inverting input node of the first differential amplifier circuit section;

a fifth resistive element connecting the inverting input node of the second differential amplifier circuit section to the second input terminal;

a sixth resistive element connecting the non-inverting input node of the second differential amplifier circuit section to the first input terminal;

a seventh resistive element connecting the inverting input node of the second differential amplifier circuit section to the output node of the second output buffer circuit; and an eighth resistive element connecting the output reference potential node to the non-inverting input node of the second differential amplifier circuit section.

16. The load driving circuit according to claim 15, wherein the first and second resistive elements have the same resistance, the third and fourth resistive elements have the same resistance, the fifth and sixth resistance elements have the same resistance, and the seventh and eighth resistive elements have the same resistance.

* * * * *